(12) United States Patent
Jiang et al.

(10) Patent No.: US 10,694,405 B2
(45) Date of Patent: Jun. 23, 2020

(54) APPARATUS AND METHOD FOR SETTING A LOCAL OSCILLATOR DUTY RATIO BASED ON AN IMAGE DISTORTION LEVEL

(71) Applicant: Futurewei Technologies, Inc., Plano, TX (US)

(72) Inventors: Hong Jiang, Kernersville, NC (US); Wael Al-Qaq, Oak Ridge, NC (US)

(73) Assignee: Futurewei Technologies, Inc., Plano, TX (US)

( * ) Notice: Subject to any disclaimer, the term of this patent is extended or adjusted under 35 U.S.C. 154(b) by 151 days.

(21) Appl. No.: 15/343,095

(22) Filed: Nov. 3, 2016

(65) Prior Publication Data

US 2018/0124616 A1 May 3, 2018

(51) Int. Cl.
| | |
|---|---|
| *H04W 24/08* | (2009.01) |
| *H03F 1/32* | (2006.01) |
| *H03D 3/00* | (2006.01) |
| *H03F 3/24* | (2006.01) |
| *H04L 5/00* | (2006.01) |
| *H04W 72/04* | (2009.01) |
| *H04B 1/04* | (2006.01) |
| *H04L 27/00* | (2006.01) |

(52) U.S. Cl.
CPC ............ *H04W 24/08* (2013.01); *H03D 3/004* (2013.01); *H03F 1/3247* (2013.01); *H03F 3/24* (2013.01); *H04L 5/0048* (2013.01); *H04W 72/044* (2013.01); *H03D 2200/0045* (2013.01); *H03D 2200/0088* (2013.01); *H04B 1/0475* (2013.01); *H04B 2001/0408* (2013.01); *H04L 2027/0016* (2013.01); *H04L 2027/0018* (2013.01)

(58) Field of Classification Search
CPC ...... H04B 1/0475; H04B 15/00; H04B 15/06; H03D 3/009; H03F 1/3241
See application file for complete search history.

(56) References Cited

U.S. PATENT DOCUMENTS

| | | | |
|---|---|---|---|
| 8,615,205 B2 | 12/2013 | Choksi et al. | |
| 8,977,211 B1 | 3/2015 | Tinella et al. | |
| 2008/0096489 A1* | 4/2008 | He | G01R 29/08 |
| | | | 455/75 |
| 2010/0297966 A1 | 11/2010 | Row et al. | |
| 2013/0029626 A1 | 1/2013 | Chen et al. | |

(Continued)

FOREIGN PATENT DOCUMENTS

CN 1801634 A 7/2006

OTHER PUBLICATIONS

Chen, Y.-H. et al., "An LTE SAW-less Transmitter using 33% Duty-Cycle LO Signals for Harmonic Suppression," International Solid-State Circuits Conference, IEEE, 2015, pp. 1-20.

(Continued)

*Primary Examiner* — Mansour Oveissi
(74) *Attorney, Agent, or Firm* — Vierra Magen Marcus LLP

(57) ABSTRACT

An apparatus and method are provided for setting a local oscillator duty ratio based on an image distortion level. A first signal is transmitted utilizing a first X-phase path of a transmitter. Further, an image distortion level is measured in connection with the first signal. Based on the measurement, a duty ratio of a local oscillator is set, for reducing a distortion in connection with a transmission of a second signal utilizing a second Y-phase path of the transmitter.

20 Claims, 12 Drawing Sheets

(56) References Cited

U.S. PATENT DOCUMENTS

2013/0135052 A1* 5/2013 Arkiszewski ............. H03F 3/19
                                                                                 330/295
2014/0194076 A1   7/2014 Hwang et al.
2017/0093609 A1* 3/2017 Avraham ............. H04B 1/1036
2017/0302308 A1 10/2017 Jiang et al.

OTHER PUBLICATIONS

Jin, P. et al., "An IQ mismatch calibration and compensation technique for wideband wireless transceivers," Journal of Semiconductors, vol. 35, No. 8, Aug. 2014, pp. 085003/1-085003/6.
Extended Search Report dated Aug. 13, 2019, in European Application No. EP17868271.2, 7 pages.

* cited by examiner

APPARATUS AND METHOD FOR SETTING A LOCAL OSCILLATOR DUTY RATIO BASED ON AN IMAGE DISTORTION LEVEL

FIELD OF THE INVENTION

The present invention relates to communication systems, and more particularly to transmitter calibration techniques.

BACKGROUND

In typical cellular transmitter designs, various impairments [e.g. image distortion, counter-intermodulation (CIM) distortion, harmonics distortion, etc.] exist. Further, various calibrations are needed, in order to correct such impairments. With multiple calibrations involved, it may take significant factory calibration time to do all the calibrations, which increases cost.

In addition, the distortion measurements are typically performed using an on-chip measurement receiver, and some calibration techniques [e.g. third-order CIM (CIM3) calibration, etc.] may require measurement of very low levels of distortions, which may be difficult. This results in a measurement receiver that must be designed with higher precision which, in turn, requires more complicated circuit design (again, increasing cost).

SUMMARY

An apparatus and method are provided for setting a local oscillator duty ratio based on an image distortion level. A first signal is transmitted utilizing a first X-phase path of a transmitter. Further, an image distortion level is measured in connection with the first signal. Based on the measurement, a duty ratio of a local oscillator is set, for reducing a distortion in connection with a transmission of a second signal utilizing a second Y-phase path of the transmitter.

In a first embodiment, the first signal may include a calibration signal. Further, the second Y-phase path of the transmitter may be disabled during the transmission of the first signal.

In a second embodiment (which may or may not be combined with the first embodiment), the first X-phase path of the transmitter may include a 4-phase path, and the second Y-phase path of the transmitter may include an 8-phase path.

In a third embodiment (which may or may not be combined with the first and/or second embodiments), the distortion that is reduced in connection with the transmission of the second signal utilizing the second Y-phase path of the transmitter, may include image distortion. Further, the distortion that is reduced in connection with the transmission of the second signal utilizing the second Y-phase path of the transmitter, may include a type of distortion other than an image distortion [e.g. counter-intermodulation (CIM) distortion, harmonic distortion, etc.].

In a fourth embodiment (which may or may not be combined with the first, second, and/or third embodiments), the transmitting, measuring, and setting may be part of a single calibration of the transmitter that is required prior to being shipped by a manufacturer of the transmitter. Further, a calibration utilizing the second Y-phase path of the transmitter may be avoided by such transmitting, measuring, and setting.

In a fifth embodiment (which may or may not be combined with the first, second, third, and/or fourth embodiments), the first signal may be calibrated, based on a measurement of an output of at least one low pass filter of the transmitter.

To this end, in some optional embodiments, one or more of the foregoing features of the aforementioned apparatus and method may provide a simpler calibration technique that is capable of correcting multiple impairments using a single calibration measurement. Further, such single calibration measurement may rely on an easier-to-measure image distortion. This may result in reduced circuit complexity and less time which, in turn, may potentially provide a cost savings that would otherwise be foregone in systems that lack such simpler calibration technique. It should be noted that the aforementioned potential advantages are set forth for illustrative purposes only and should not be construed as limiting in any manner.

DETAILED DESCRIPTION

Figure 1:
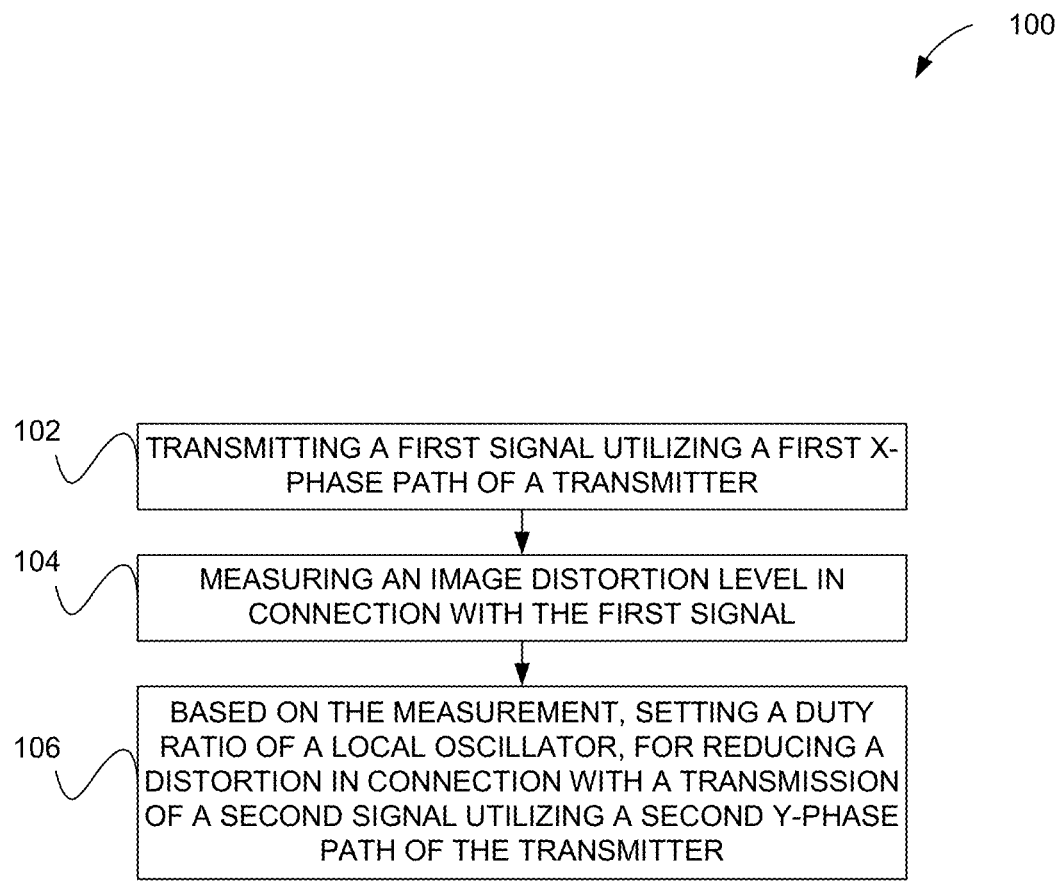
FIG. 1 illustrates a method for setting a local oscillator duty ratio based on an image distortion level, in accordance with one embodiment.

FIG. 1 illustrates a method 100 for setting a local oscillator duty ratio based on an image distortion level, in accordance with one embodiment. As shown, in operation 102, a first signal is transmitted utilizing a first X-phase path of a transmitter. In the context of the present description, the first signal may include any signal capable of being transmitted via the transmitter. For example, in one embodiment, the first signal may include a calibration signal.

Further, the transmitter may include any circuitry configured for causing transmission of radio frequency (RF) signals. Further, the first X-phase path of the transmitter may include any circuit, componentry and/or conductive element that is capable of carrying, storing, and/or processing the first signal in a form where the first signal has multiple (e.g. any integer X) phases.

With continuing reference to FIG. 1, an image distortion level is measured in connection with the first signal, per operation 104. In the context of the present description, such image distortion level may refer to any amplitude of image distortion exhibited by the first signal. In a double-sideband transmitter embodiment, such image distortion may refer to an upper-sideband signal that is exhibited at a lower-sideband (and vice versa). More information regarding exemplary image distortion will be set forth in greater detail during reference to subsequent embodiments/figures.

Based on the measurement in operation 104, a duty ratio of a local oscillator is set in operation 106, for reducing a distortion in connection with a transmission of a second signal utilizing a second Y-phase path of the transmitter. In the present description, the local oscillator may include any oscillating circuit or element that produces a repetitive signal that controls at least one aspect or component (e.g. a mixer, etc.) of the first X-phase path and/or the second Y-phase path of the transmitter. Further, the duty ratio may refer to any relative amount that the aforementioned repetitive signal is pulsed versus when it is not (e.g. level=0, substantially 0, less than a pulse, etc.).

Still yet, the second signal may include any signal (e.g. data transmission signal, etc.) capable of being transmitted via the transmitter, while the second Y-phase path of the transmitter may include any circuit, componentry and/or conductive element that is capable of carrying, storing, and/or processing the second signal in a form where the second signal has multiple (e.g. any integer Y≠X) phases. In one exemplary embodiment, the first X-phase path of the transmitter may include a 4-phase path, and the second Y-phase path of the transmitter may include an 8-phase path. With that said, other embodiments are contemplated where the first X-phase path and the second Y-phase path have any different number of phases (e.g. 4/16, 4/12 etc.).

As mentioned earlier, the local oscillator duty ratio is set as a function of the first signal measurement (in connection with the first X-phase path), for reducing a distortion in connection with a transmission of the second signal utilizing the second Y-phase path of the transmitter. In various embodiments, such distortion (of the second signal) may or may not include the image distortion. To this end, in one embodiment, a type of the distortion (that is reduced) may include a type other than the image distortion [e.g. counter-intermodulation (CIM) distortion, harmonic distortion, etc.]. More information regarding such other types of distortion will be set forth in greater detail during reference to subsequent embodiments/figures.

To this end, in one possible embodiment, the first signal may be transmitted as a calibration signal in connection with a single calibration of the transmitter (that is required prior to being shipped), and the second Y-phase path of the transmitter may be disabled during the transmission of the first signal. Thus, such first signal may be the sole basis for adjusting the local oscillator duty ratio for affording distortion reduction during use of the second Y-phase path (after being shipped/calibrated). In other words, a calibration utilizing the second Y-phase path of the transmitter may, in one embodiment, be avoided using the method 100 of FIG. 1.

Thus, in some optional embodiments, one or more of the foregoing features may provide a simpler calibration technique that is capable of correcting multiple impairments using a single calibration measurement. Further, such single calibration measurement may rely on an easier-to-measure image distortion. This may result in reduced circuit complexity and less time which, in turn, may potentially provide a cost savings that would otherwise be foregone in systems that lack such simpler calibration technique. It should be noted that the aforementioned potential advantages are set forth for illustrative purposes only and should not be construed as limiting in any manner.

More illustrative information will now be set forth regarding various optional architectures and uses in which the foregoing method may or may not be implemented, per the desires of the user. For example, the first signal may, in one optional embodiment, be calibrated, based on a measurement of an output of at least one low pass filter of the transmitter, as will become apparent later. It should be noted that the following information is set forth for illustrative purposes and should not be construed as limiting in any manner. Any of the following features may be optionally incorporated with or without the exclusion of other features described.

Figure 2:
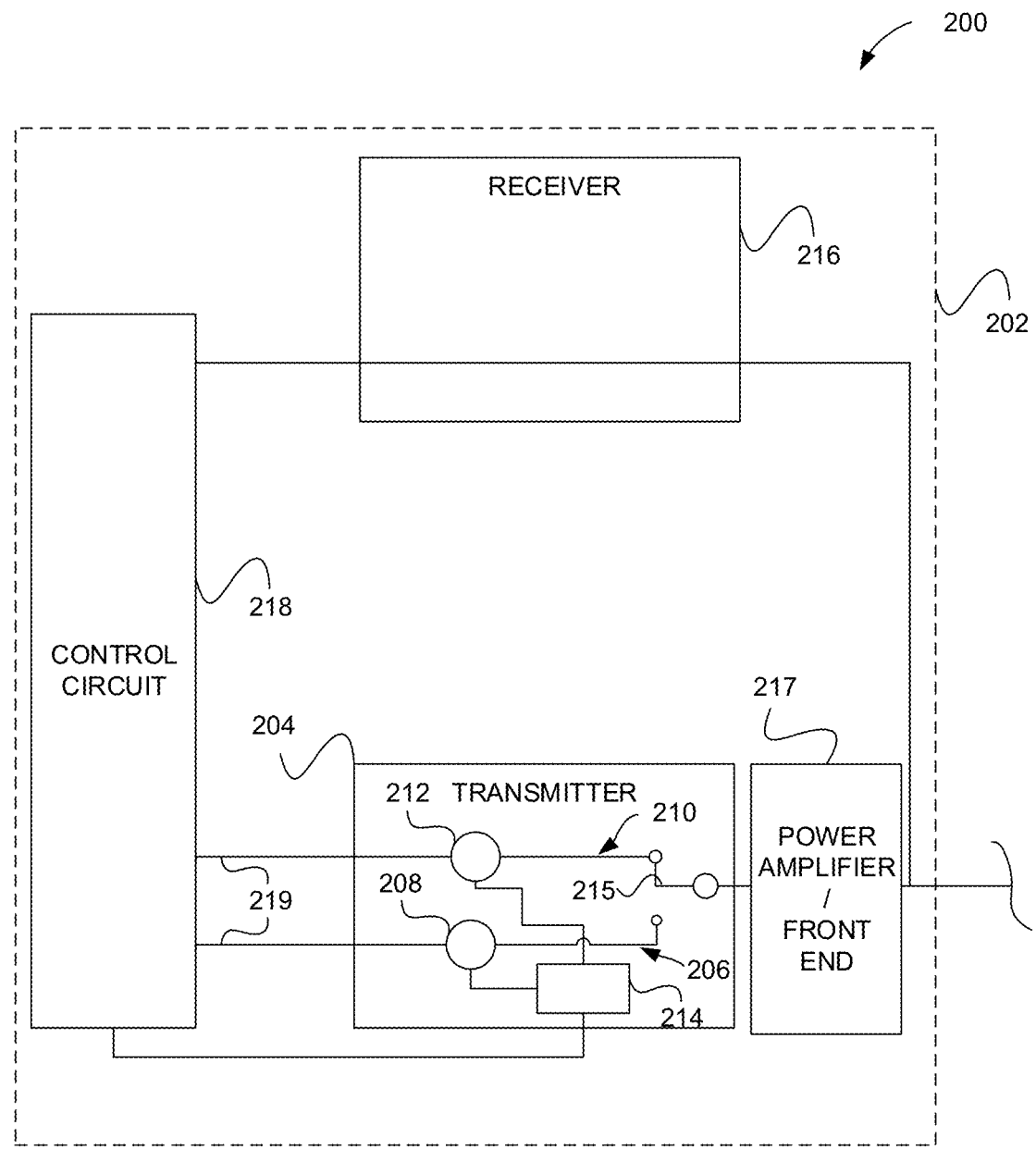
FIG. 2 illustrates a system for setting a local oscillator duty ratio based on an image distortion level, in accordance with one embodiment.

FIG. 2 illustrates a system 200 for setting a local oscillator duty ratio based on an image distortion level, in accordance with one embodiment. As an option, the system 200 may be implemented in the context of any one or more of the embodiments set forth in any previous and/or subsequent figure(s) and/or description thereof. For example, the system 200 may be configured to carry out the method 100 of FIG. 1. However, it is to be appreciated that the system 200 may be implemented in the context of any desired environment.

As shown, the system 200 includes a transceiver 202 having a transmitter 204 including: a first X-phase path 206 with at least one element/component 208 (e.g. a conductive element, mixer, etc.), and a second Y-phase path 210 with at least one element/component 212 (e.g. a conductive element, mixer, etc.). In various embodiments, X<Y such that the first X-phase path 206 utilizes fewer phases with respect to the second Y-phase path 210. The transmitter 204 further includes a local oscillator 214 for driving at least one aspect (e.g. the elements/components 208, 212, etc.) of the first X-phase path 206 and the second Y-phase path 210. For example, in one embodiment, the local oscillator 214 may serve to drive a cycle rate of mixers to control a rate at which the first X-phase path 206 and the second Y-phase path 210 cycle through the relative phases. Still yet, a switch 215 may be provided for switching between the first X-phase path 206 and the second Y-phase path 210 so that output is enabled only from one (while the other is optionally disabled, for power savings).

With continuing reference to FIG. 2, the system 200 includes a power amplifier/front end 217 and a receiver 216 in electrical communication with an output of the transmitter 204, for receiving signals emitted therefrom. Further provided is a control circuit 218 that is in electrical communication with the receiver 216, and an input 219 and the local oscillator 214 of the transmitter 204.

In use, the control circuit 218 serves to provide a calibration signal at the input 219 of the transmitter 204 while the switch 215 enables emission of the signal solely via the first X-phase path 206, while being driven by the local oscillator 214 (and while the second Y-phase path 210 is optionally powered down). By this design, the receiver 216 is capable of receiving the signal and directing the same back to the control circuit 218 for measuring an image distortion level thereof. Armed with such measured image distortion level, the control circuit 218 may use a correlation between such image distortion and a local oscillator duty ratio, to identify any error in the duty ratio and correct the same (via the local oscillator 214). More information will now be set forth on a relationship between the local oscillator duty ratio error and various distortions (e.g. image, CIM, harmonics, etc. distortion).

Figure 3A:
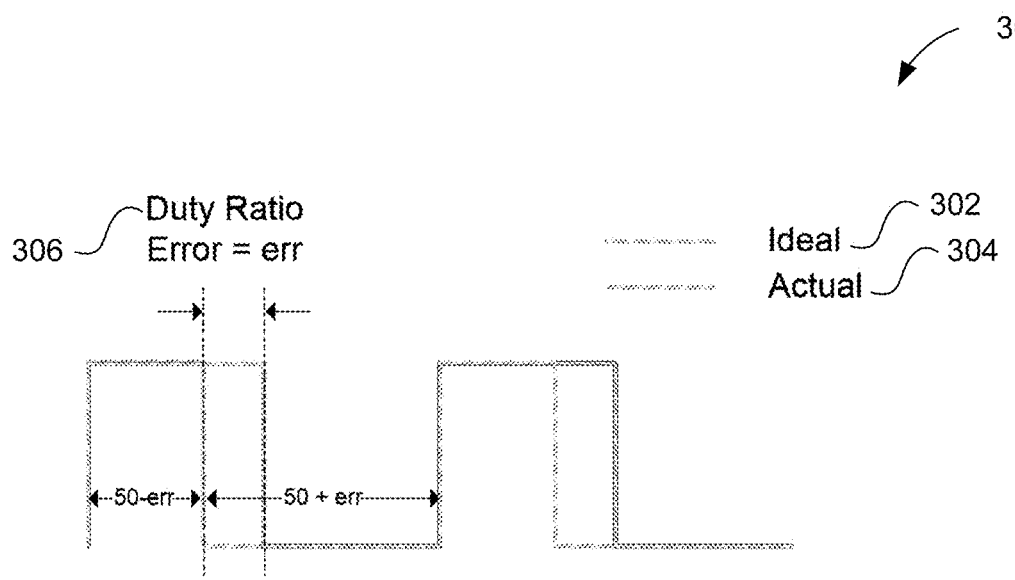
FIG. 3A illustrates a sample plot of an output of a local oscillator, in accordance with one embodiment.

FIG. 3A illustrates a sample plot 300 of an output of an local oscillator, in accordance with one embodiment. As shown, the sample plot 300 shows an ideal plot 302 and an actual plot 304 with an error 306 therebetween. During use of a transmitter (e.g. the transmitter 204 of FIG. 2, etc.), operating in either a 4-phase or 8-phase mode, the local oscillator duty ratio error is a significant impairment and dominates various transmitter performance parameters including 4-phase mode image distortion, 8-phase mode CIM distortion, 8-phase mode harmonics distortion, etc. Therefore, estimating and correcting the duty ratio error may, in one embodiment, reduce all three distortion levels.

As shown in the plot 300 of FIG. 3A, the local oscillator deviates 50% from an input clock, and both rising and falling edges are used to generate the output clock. Thus, the duty ratio error may translate to the output and create asymmetrical output signals. For example, in a 4-phase mode, the output may exhibit a pattern (in percent) of "25−Δ", "25+Δ", "25−Δ", "25+Δ;" and, in a 8-phase mode, the output may exhibit a pattern (in percent) of "12.5−Δ", "12.5+Δ", "12.5−Δ", "12.5+Δ", "12.5−Δ", "12.5+Δ", "12.5−Δ", "12.5+Δ;" where Δ=err/2 or Δ=err/4 for the 4-phase mode and 8-phase mode, respectively. In one strictly optional embodiment, 25 and 12.5 may be an ideal duty ratio (in percent) for 4-phase and 8-phase modes of operation.

As mentioned earlier, there is a direct relationship between duty ratio error and the various aforementioned distortions. An impact of duty ratio error on 4-phase image distortion will be addressed first. Under a 4-phase mode of operation, a gain of one path (e.g. an I path of an I/Q modulation scheme) is proportional to 25−Δ, and a gain of another path (e.g. a Q path) is proportional to 25−Δ, where 25 is the ideal duty ratio in percent and Δ is the error (deviating from 25%). When Δ=0, the I path gain is the same as Q path gain, i.e. they are perfectly matched. When Δ≠0, the I path gain is different from Q path gain, i.e. gain mismatch exists. Thus, a reduction in the duty ratio error reduces the I/Q gain mismatch.

There is an impact of duty ratio error on 8-phase harmonics distortion, as well. In an 8-phase mode of operation, harmonics are cancelled by combining 8-phases of signals. Using a key "3fLO−fBB" harmonic as an example, the following shows the relationship between duty ratio error and third harmonics. Specifically, assuming the "12.5−Δ", "12.5+Δ", "12.5−Δ", "12.5+Δ", "12.5−Δ", "12.5+Δ", "12.5−Δ", "12.5+Δ" output clock pattern described above and defining ε=Δ/12.5*π/4, one can derive the following. Specifically, for a square clock, signal 0/2/4/6 has an "on-time" of 2*α1=π/4−ε, and signal 1/3/5/7 has an "on-time" of 2*α2=π/4+ε. Thus, the residual third harmonics level (after non-perfect cancellation) is proportional to Equation #1.

$$\sin(3*\alpha_1) - \sin(3*\alpha_2) = \qquad \text{Equation \#1}$$
$$2*\cos\left(\frac{3*(\alpha_1 + \alpha_2)}{2}\right) * \sin\left(\frac{3*(\alpha_1 - \alpha_2)}{2}\right) =$$
$$2*\cos\left(\frac{3*\pi}{8}\right) * \sin(\varepsilon)$$

when ε is small, and the local oscillator signal is proportional to ε or Δ.

Regarding the duty ratio error impact on 8-phase CIM distortion, the dominant cause of CIM distortion typically is the mixing of a fundamental signal with harmonics (3fLO−fBB, 5fLO+fBB) through the non-linearity behavior of a transceiver RF variable gain amplifier (VGA) stage or power amplifier (PA), as reflected in Equation #2.

CIM3: (3*fLO−fbb)−2*(fLO+fbb)=fLO−3*fbb

CIM5: 4*(fLO+fbb)−(3*fLO−fbb)=fLO+5*fbb  Equation #2

As shown above, the 3rd or 5th harmonics are linearly proportional to the duty ratio error, which means CIM3 and CIM5 distortions are linearly proportional to the clock duty ratio error, as well. Thus, all three impairments (e.g. image, CIM, and harmonics) are linearly proportional to the duty ratio error, such that adjusting the duty ratio reduces all three impairments levels.

Figure 3B:
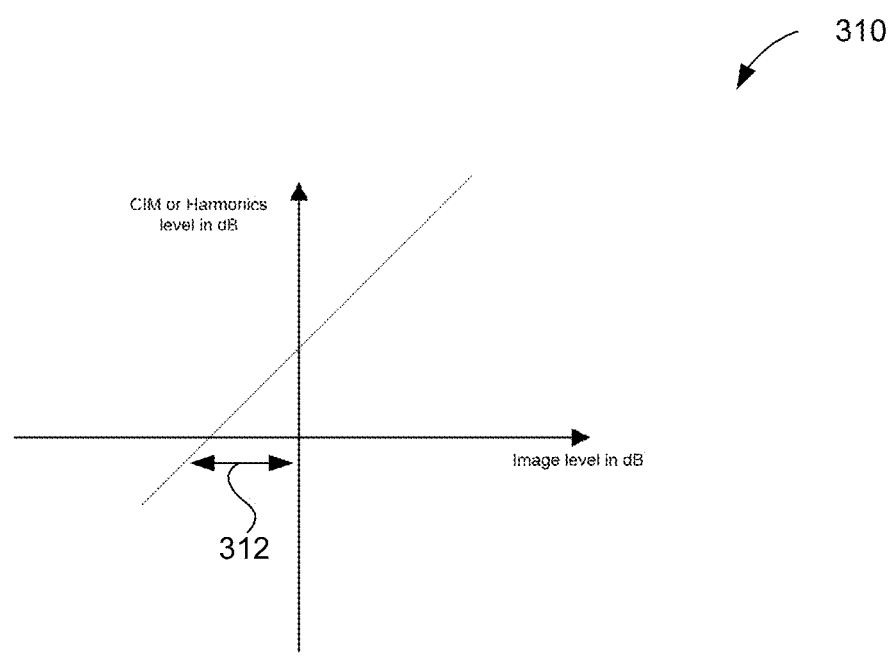
FIG. 3B is a plot of an image distortion level versus harmonics or CIM distortion, in accordance with one embodiment.

FIG. 3B is a plot 310 of an image distortion level versus harmonics or CIM distortion, in accordance with one embodiment. As shown, the plot exhibits a slope of one (1), since all three distortions (e.g. image, CIM, and harmonics) are linearly proportional to duty ratio error. An offset 312 of the linear line of the plot 310 is determined by a linearity of an RF VGA, PA, and/or frequency response of the VGA, etc. However, the offset 312 is fixed for a fixed design of transmission componentry (e.g. mixer, transmitter RF VGA, PA, etc.). More information regarding examples of such componentry will be set forth later during the description of subsequent embodiments/figures. In the meantime, more information on various techniques for adjusting a clock duty ratio will now be set forth.

Figure 4:
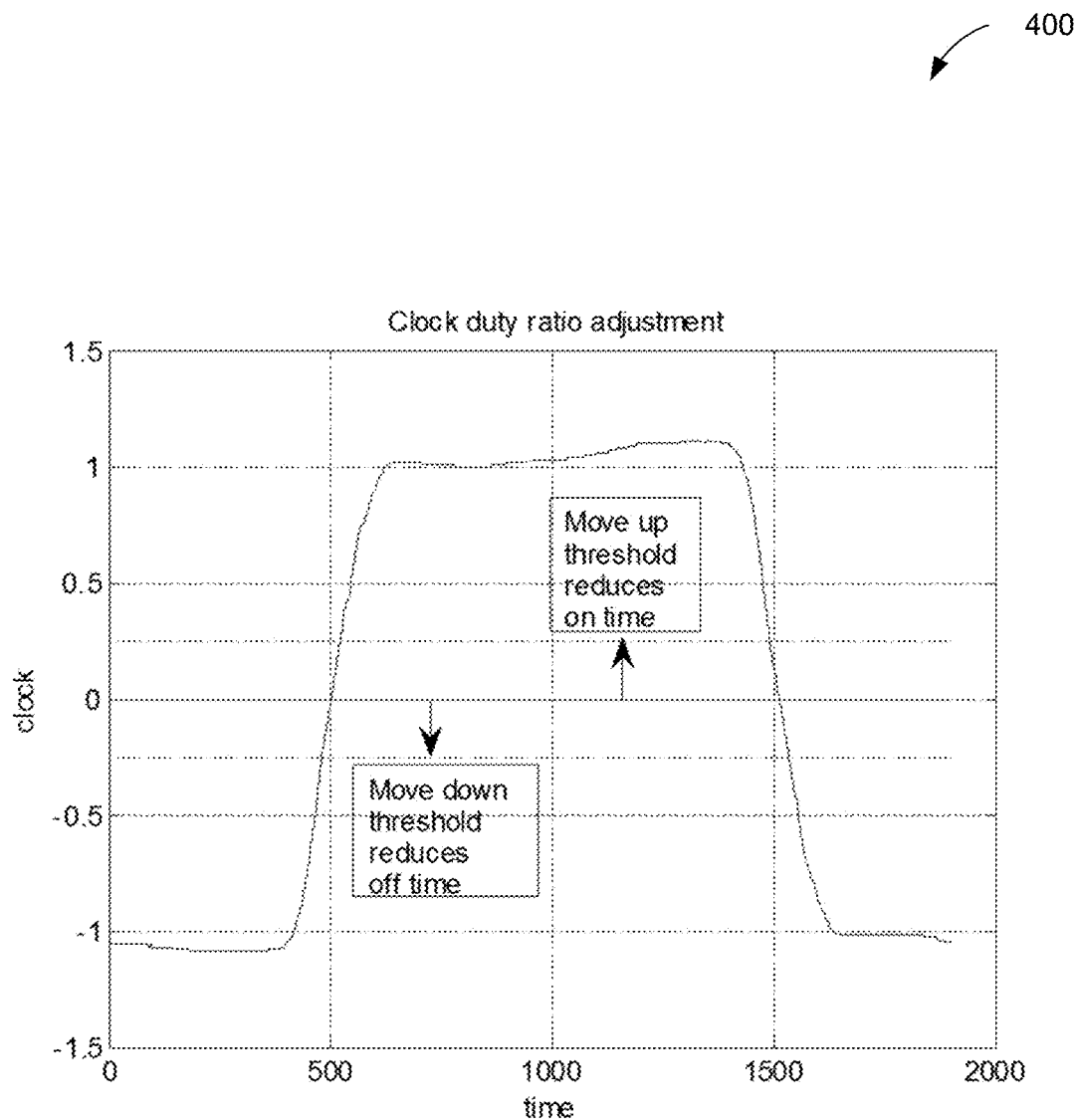
FIG. 4 illustrates a plot showing a relationship between a clock duty ratio (as defined by clock pulses over time), and a threshold voltage of a local oscillator.

FIG. 4 illustrates a plot 400 showing a relationship between a clock duty ratio (as defined by clock pulses over time), and a threshold voltage of a local oscillator. As shown, the clock duty ratio may be adjusted by adjusting a divider input threshold voltage. Specifically, moving such threshold level up effectively reduces a "clock on" duty, and moving the threshold level down effectively reduces a "clock off" time. In another words, the clock duty ratio may be adjusted by moving the threshold voltage up and down.

Figure 5A:
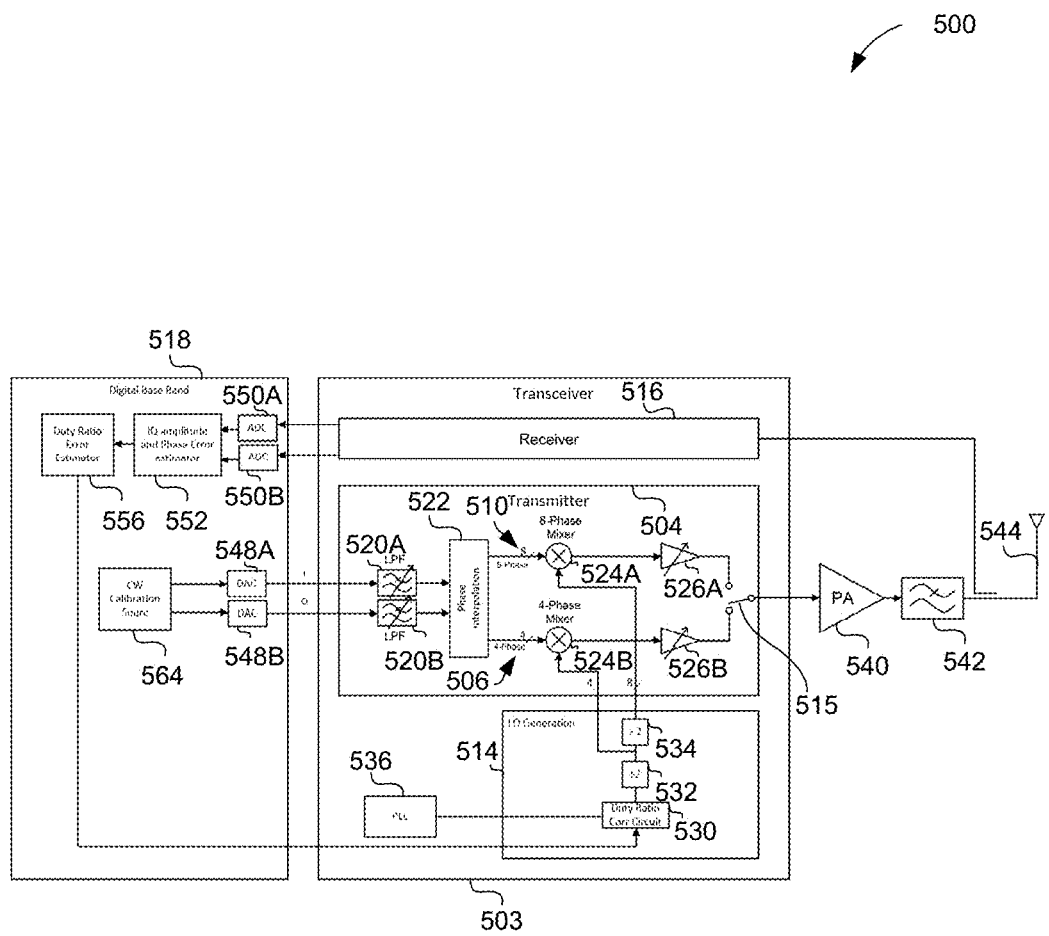
FIG. 5A illustrates a system for setting a local oscillator duty ratio based on an image distortion level, in accordance with another embodiment.

FIG. 5A illustrates a system 500 for setting a local oscillator duty ratio based on an image distortion level, in accordance with another embodiment. As an option, the system 500 may be implemented in the context of any one or more of the embodiments set forth in any previous and/or subsequent figure(s) and/or description thereof. For example, the system 500 may be configured to carry out the method 100 of FIG. 1. However, it is to be appreciated that the system 500 may be implemented in the context of any desired environment.

Similar to the system 200 of FIG. 2, the system 500 includes a transceiver 503 having a transmitter 504 including: a first X-phase path 506, and a second Y-phase path 510, where X<Y. The transceiver 503 further includes a local oscillator (LO) generation circuit 514 and a switch 515. Further, the system 500 includes a receiver 516, and control circuitry 518. Each of the forgoing components may operate similar to the corresponding components (e.g. 202, 204, 206, 210, 214, 216, and 218, etc.) of FIG. 2.

In contrast, the first X-phase path 506, and the second Y-phase path 510 of the transmitter 504 include a pair of filters 520A, 520B for filtering an input signal, a phase interpolation circuit 522 for generating the proper input signals to the mixer, a pair of mixers 524A, 524B for mixing the different phases across the signal, and a pair of variable gain amplifiers 526A, 526B for amplifying the mixed signal, all serially interconnected in the manner shown. Further, the LO generation circuit 514 includes a duty ratio correction circuit 530 that is configured for activating (e.g. see pulse signal of FIG. 4, etc.) the mixers 524A, 524B at a predetermined frequency via a pair of dividers 532, 534 interconnected in the manner shown.

During operation of the LO generation circuit 514, the dividers 532, 534 divide (e.g. by two, etc.) a frequency of an output of the duty ratio correction circuit 530 such that the mixers 524A, 524B of the different paths 506, 510 are driven at different frequencies. Further, the output of the duty ratio correction circuit 530 is governed by a clock signal from a phase locked loop (PLL) 536 and a code word received from the control circuitry 518, in a manner that will soon become apparent.

As further shown in FIG. 5A, the system 500 is equipped with a power amplifier 540 for amplifying an output of the transmitter 504. Further, a bandpass filter 542 (e.g. duplexer, etc.) is provided for further filtering the output of the transmitter 504, before transmission via an antenna 544 and further feeding back the output signal to the receiver 516.

Turning to the control circuitry 518, included is a continuous wave (CW) calibration source 564 for generating I/Q channel signals. As mentioned earlier, such I/Q channel signals may be emitted by the CW calibration source 564, as calibration signals. In one embodiment, such calibration signals may include single-tone/frequency signals. Further, the CW calibration source 564 may be in communication with a pair of digital to analog converters 548A, 548B which convert the I/Q channel signals from a digital format to an analog format, before feeding the same to the low pass filters 520A, 520B of the transmitter 504 for being passed to the antenna 544 (and the receiver 516) via the first X-phase path 506 for being measured by the control circuitry 518 for calibration purposes, as will soon become apparent.

To accomplish this, the control circuitry 518 further includes a pair of analog to digital converters 550A, 550B that are in communication with the receiver 516 for independently receiving both I/Q channel signals from the receiver 516 and converting such signals from an analog format to a digital format. Further provided is an IQ amplitude and phase error estimator 552 in communication with the analog to digital converters 550A, 550B for receiving the digital I/Q channel signals therefrom. In use, the IQ amplitude and phase error estimator 552 measures a level of image distortion in the digital I/Q channel signals and, as an option, any phase component of such image distortion (albeit smaller). In one embodiment, the IQ amplitude and phase error estimator 552 may serve to estimate a path gain mismatch (e.g. error in the Q channel signal versus error in the I channel signal, etc.).

Armed with such image distortion level, the IQ amplitude and phase error estimator 552 feeds the same to a duty ratio error estimator 556. In use, the duty ratio error estimator 556 translates the image distortion level to a particular code word that is associated with a particular duty ratio correction amount. In one embodiment, such translation may be accomplished utilizing a look-up table such that set forth in Table 1.

TABLE 1

| image_distortion_level_1 | code_word_1 (associated with a first correction amount) |
|---|---|
| image_distortion_level_2 | code_word_2 (associated with a second correction amount) |
| image_distortion_level_3 | code_word_3 (associated with a third correction amount) |

In one embodiment, such look-up table may be stored in memory for use with a circuit to cause a duty ratio of the local oscillator to be set based on the image distortion (via the code words, etc.). It should be noted, however, that other translation techniques (e.g. using translation digital logic, etc.) may be employed, in other embodiments.

In any case, the code word is output from the duty ratio error estimator 556 to the duty ratio correction circuit 530 of the LO generation circuit 514, and the duty ratio correction circuit 530 serves to raise or lower the voltage threshold to achieve the associated duty ratio correction amount. The specific relationship between the image distortion levels, the specific code words, the voltage thresholds/duty ratio correction amounts, etc. may all be set as a function of design-specific parameters associated with the components (e.g. 520A, 520B, 522, 524A, 524B, 526A, and/or 526B, etc.) of the first X-phase path 506 (and possibly the second Y-phase path 510) of the transmitter 504, so that an optimal duty ratio correction amount is prompted by the measured image distortion level.

Figure 5B:
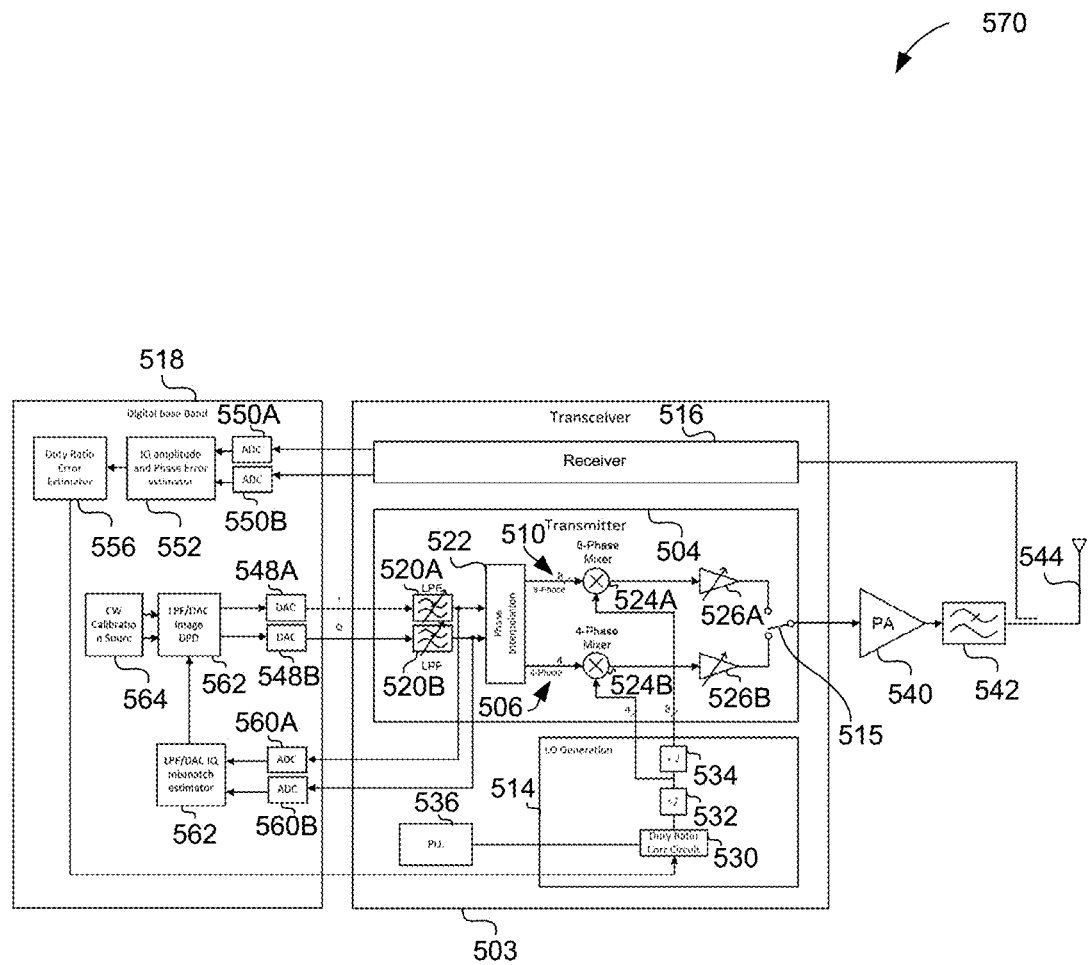
FIG. 5B illustrates a system for adjusting a calibration signal, in accordance with yet another embodiment.

FIG. 5B illustrates a system 570 for adjusting a calibration signal, in accordance with yet another embodiment. As an option, the system 570 may be implemented in the context of any one or more of the embodiments set forth in any previous and/or subsequent figure(s) and/or description thereof. For example, the system 570 may be configured to carry out the method 100 of FIG. 1. However, it is to be appreciated that the system 570 may be implemented in the context of any desired environment.

Similar to the system 500 of FIG. 5A, the system 570 includes the transceiver 503 and the associated components [the description of which (in reference to FIG. 5A) is incorporated herein by reference]. However, in addition, the control circuitry 518 of the system 570 further includes a pair of analog to digital converters 560A, 560B that are fed by a tap at an output of the low pass filters 520A, 520B of the transmitter 504, for translating signals at such tap from an analog format to a digital format. Such analog to digital converters 560A, 560B are in communication with a low pass filter (LPF)/digital to analog convert (DAC) IQ mismatch estimator 562 which, in turn, is communication with a LPF/DAC image digital pre-distortion (DPD) module 562 that sits between the CW calibration source 564 and the pair of digital to analog converters 548A, 548B, as shown.

If further accuracy is needed, the LPF/DAC IQ mismatch estimator 562 and the LPF/DAC image DPD module 562 may serve to calibrate an analog section of the first X-phase path 506 (and possibly the second Y-phase path 510) of the transmitter 504 including the digital to analog converters 548A, 548B and the low pass filters 520A, 520B. Specifically, such calibration may serve to remove the image distortion generated by the foregoing components, by the LPF/DAC IQ mismatch estimator 562 identifying an error at an output of the low pass filters 520A, 520B which was caused by the analog to digital converters 560A, 560B and/or the low pass filters 520A, 520B. Further, the LPF/DAC image DPD module 562 serves to remove such error by adding an image signal (that corresponds to the error) to the calibration signal.

After such LPF/DAC image correction, the only image impairment left may be caused by clock duty ratio error. To this end, such clock duty ratio-related impairment may be corrected in the manner described earlier (an example of which will now be set forth).

Figure 6:
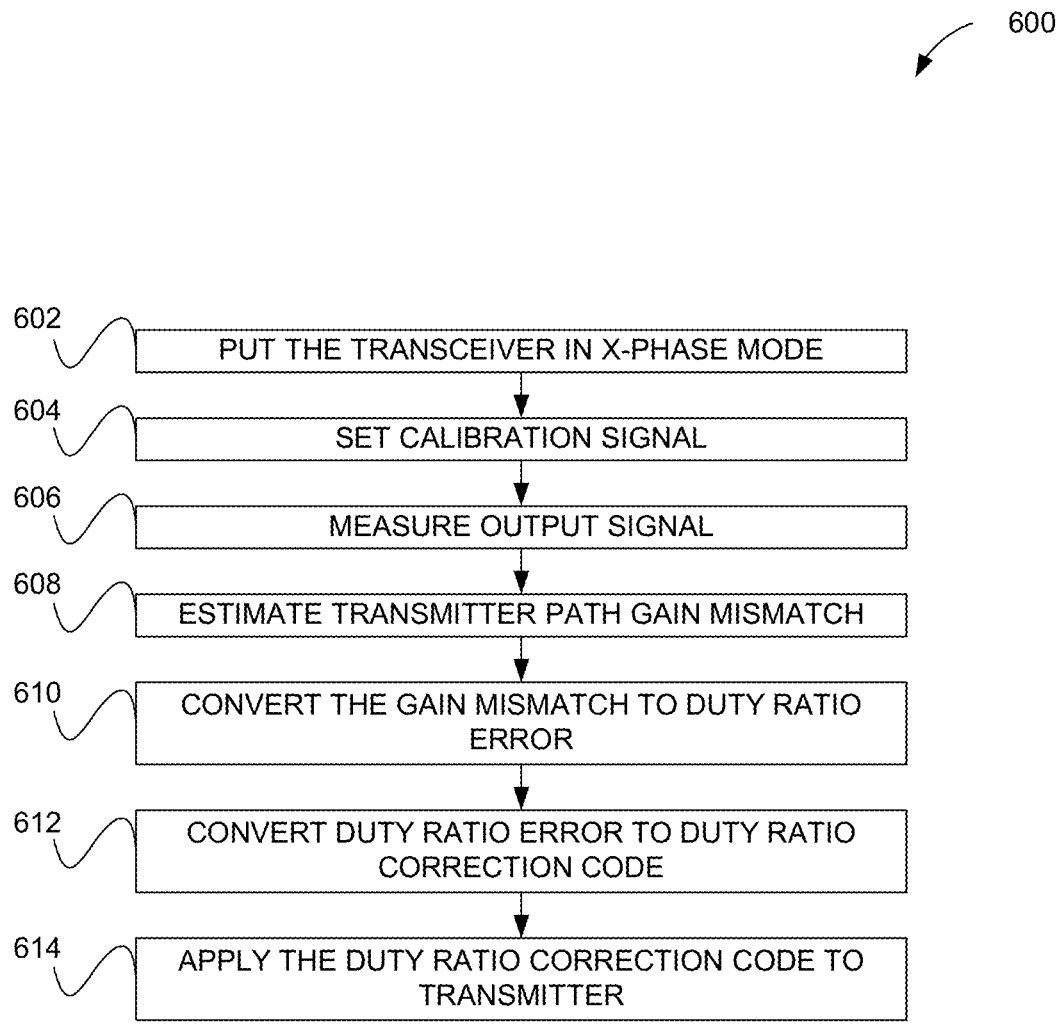
FIG. 6 illustrates a method for setting a local oscillator duty ratio based on an image distortion level, in accordance with one embodiment.

FIG. 6 illustrates a method 600 for setting a local oscillator duty ratio based on an image distortion level, in accordance with one embodiment. As an option, the method 600 may be implemented in the context of any one or more of the embodiments set forth in any previous and/or subsequent figure(s) and/or description thereof. For example, the method 600 may be implemented in the context of the system 200 of FIG. 2, the system 500 of FIG. 5A, and/or the system 570 of FIG. 5B. However, it is to be appreciated that the method 600 may be implemented in the context of any desired environment.

As shown, method 600 begins by placing a transceiver in an X-phase mode. See operation 602. In one embodiment, this may be accomplished via a switch (e.g. the switch 215 of FIG. 2, switch 515 of FIGS. 5A/5B, etc.) that selects an X-phase path (e.g. the X-phase path 206 of FIG. 2, the X-phase path 506 of FIGS. 5A/5B, etc.).

Next, in operation 604, the calibration signal may be set and emitted as an output signal of a transmitter of the transceiver. Strictly, as an option, the calibration signal itself may be calibrated, as well. See, for example, the system 570 of FIG. 5B.

Further, in operation 606, the output signal of the transmitter of the transceiver may be received by a receiver [e.g. a (image-calibrated) measurement receiver, etc.], and measured. Still yet, a transmitter path gain mismatch may be estimated by any desired module (e.g. control circuit 218 of FIG. 2, the IQ amplitude and phase error estimator 552 of FIGS. 5A/5B, etc.). See operation 608. As mentioned earlier, such transmitter path gain mismatch may be dominated by a clock duty ratio error.

Such gain mismatch may then be converted to a duty ratio error in operation 610, and the duty ratio error may be converted to a duty ratio correction code in operation 612. In various embodiments, this may be accomplished using any desired technique (e.g. using one or more look up tables, etc.). Further, other embodiments are contemplated where the gain mismatch (or any image distortion measurement, for that matter) is converted directly to the duty ratio correction code (or any other mechanism for controlling the duty ratio). Still yet, this may be accomplished using any desired module (e.g. control circuit 218 of FIG. 2, the duty ratio error estimator 556 of FIGS. 5A/5B, etc.).

To this end, the duty ratio correct code may be applied to the transmitter via any desired module of (e.g. or associated with, etc.) a LO generation circuit using any desired module (e.g. part of the local oscillator 214 of FIG. 2, the duty ratio correction circuit 530 of FIGS. 5A/5B, etc.). See operation 614. Thus, the method 600 may serve to correct all three impairments (e.g. image, CIM, and harmonics distortion, etc.) with a single image calibration measurement, which reduces calibration complexity and calibration time. Further, with respect to the CIM distortion, the method 600 need only measure the image distortion level (which may be easier to measure), without directly measuring the sometimes harder-to-measure CIM distortion level (since it may be very low, for example). In some embodiment, such easier measurement may also translate into fewer design requirements on the part of the measurement receiver and/or other componentry.

Figure 7A:
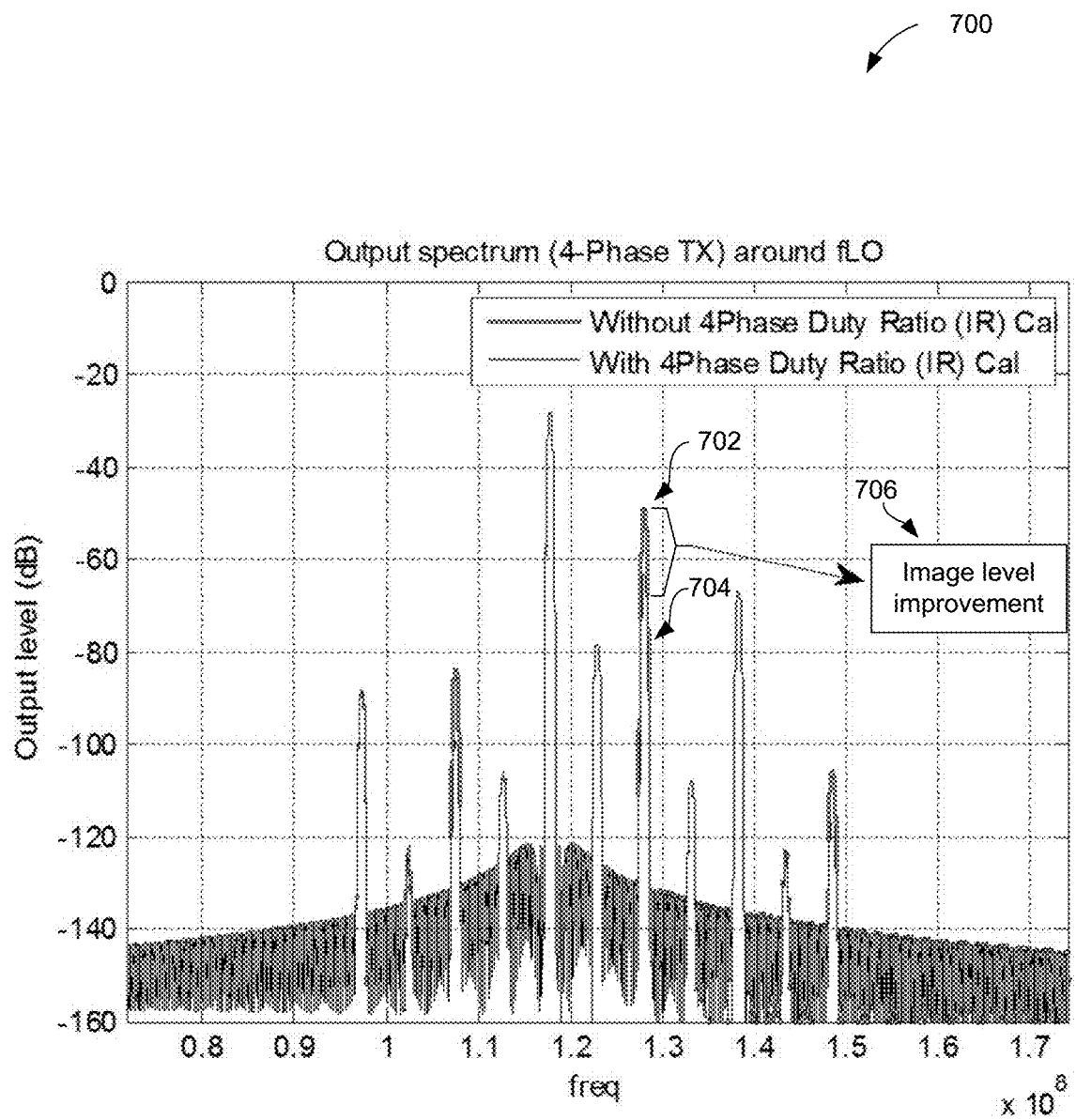
FIG. 7A illustrates a plot showing 4-phase mode image distortion with and without clock duty ratio calibration.
Figure 7B:
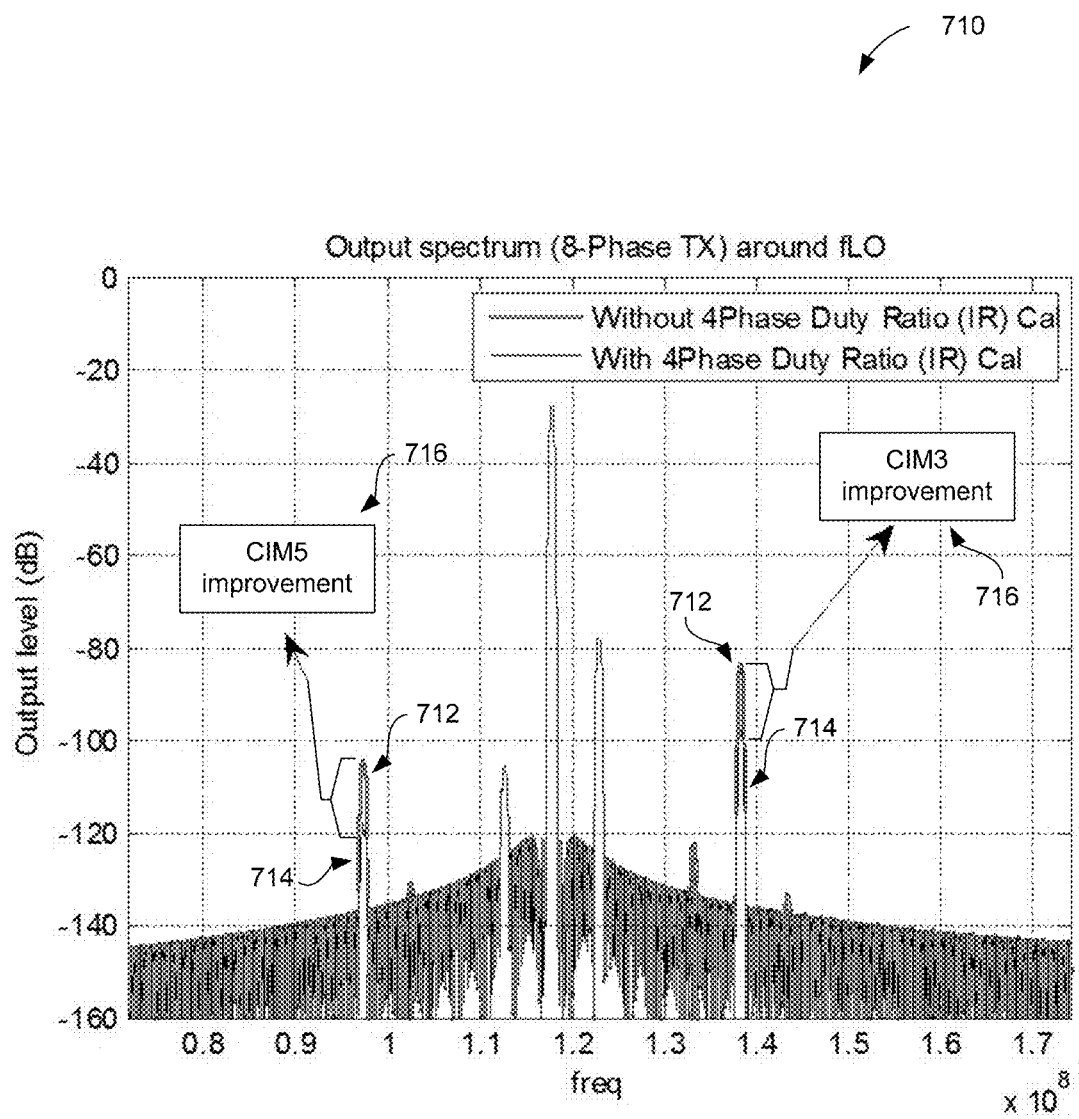
FIG. 7B illustrates a plot showing 8-phase mode CIM distortion with and without clock duty ratio calibration.
Figure 7C:
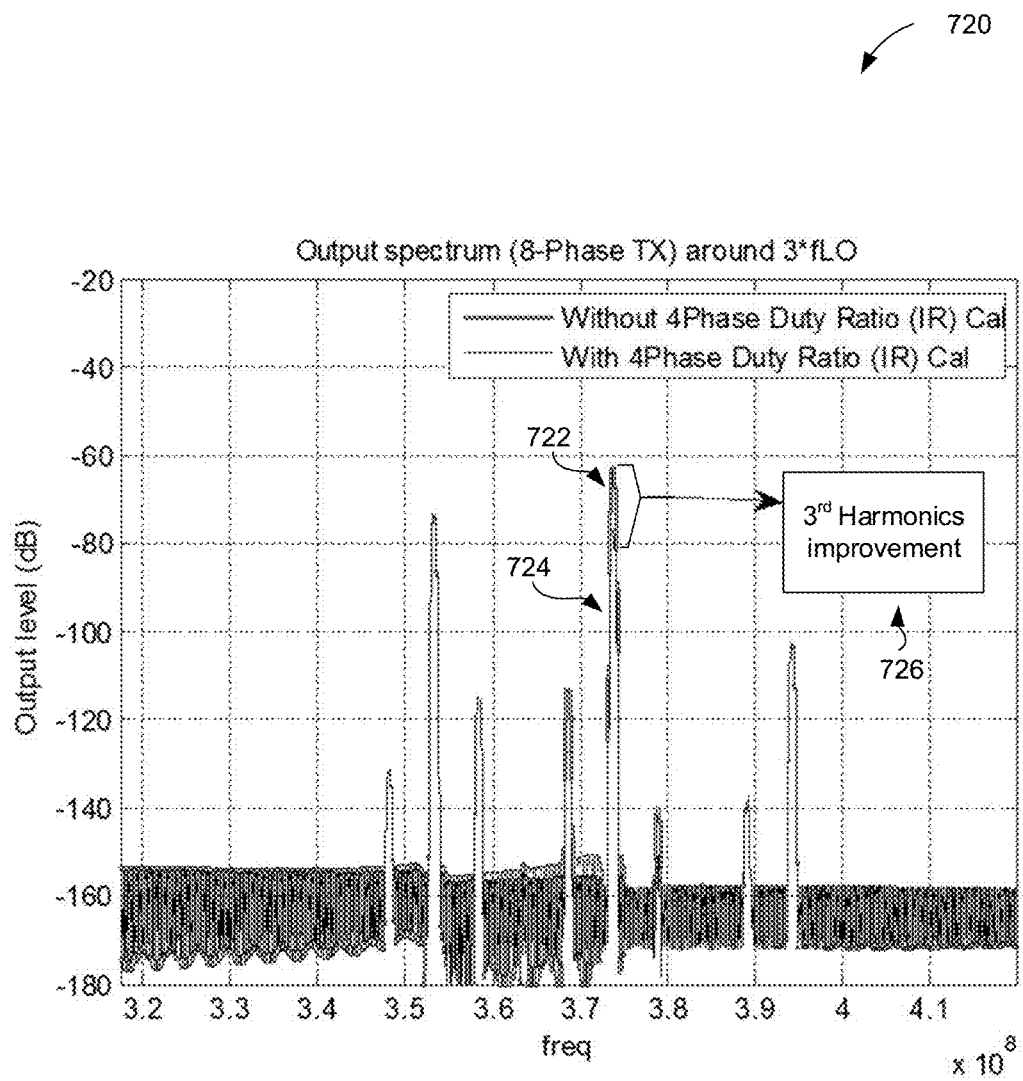
FIG. 7C illustrates a plot showing 8-phase mode harmonics distortion with and without clock duty ratio calibration.

FIGS. 7A, 7B, and 7C illustrate various plots that illustrate a potential for improved calibration, in accordance with some optional embodiments. Specifically, FIG. 7A illustrates a plot 700 showing 4-phase mode image distortion with and without clock duty ratio calibration. In particular, the plot 700 shows a first image distortion 702 without clock duty ratio calibration, and a second image distortion 704 with clock duty ratio calibration, with an improvement 706 therebetween.

FIG. 7B illustrates a plot 710 showing 8-phase mode CIM distortion with and without clock duty ratio calibration. In particular, the plot 710 shows a first CIM distortion 712 without clock duty ratio calibration, and a second CIM distortion 714 with clock duty ratio calibration, with an improvement 716 therebetween. It should be noted that the plot 710 shows both third order- and fifth order-CIM (CIM3, CIM5) improvements.

As mentioned earlier, CIM distortion could become problematic even in a transmitter operating in an 8- or higher-phase mode (and such CIM is harder to calibrate). With that said, the CIM distortion coincides with image distortion (as also mentioned earlier). Thus, by addressing only the image distortion in 4-phase mode, other types of distortion (e.g. CIM, harmonics, etc.) may also be rectified (in other modes), in a more time/cost effective/efficient manner.

As for harmonics distortion, FIG. 7C illustrates a plot 720 showing 8-phase mode harmonics distortion with and without clock duty ratio calibration. In particular, the plot 720 shows a first harmonics distortion 722 without clock duty ratio calibration, and a second harmonics distortion 724 with clock duty ratio calibration, with an improvement 726 therebetween.

Figure 8:
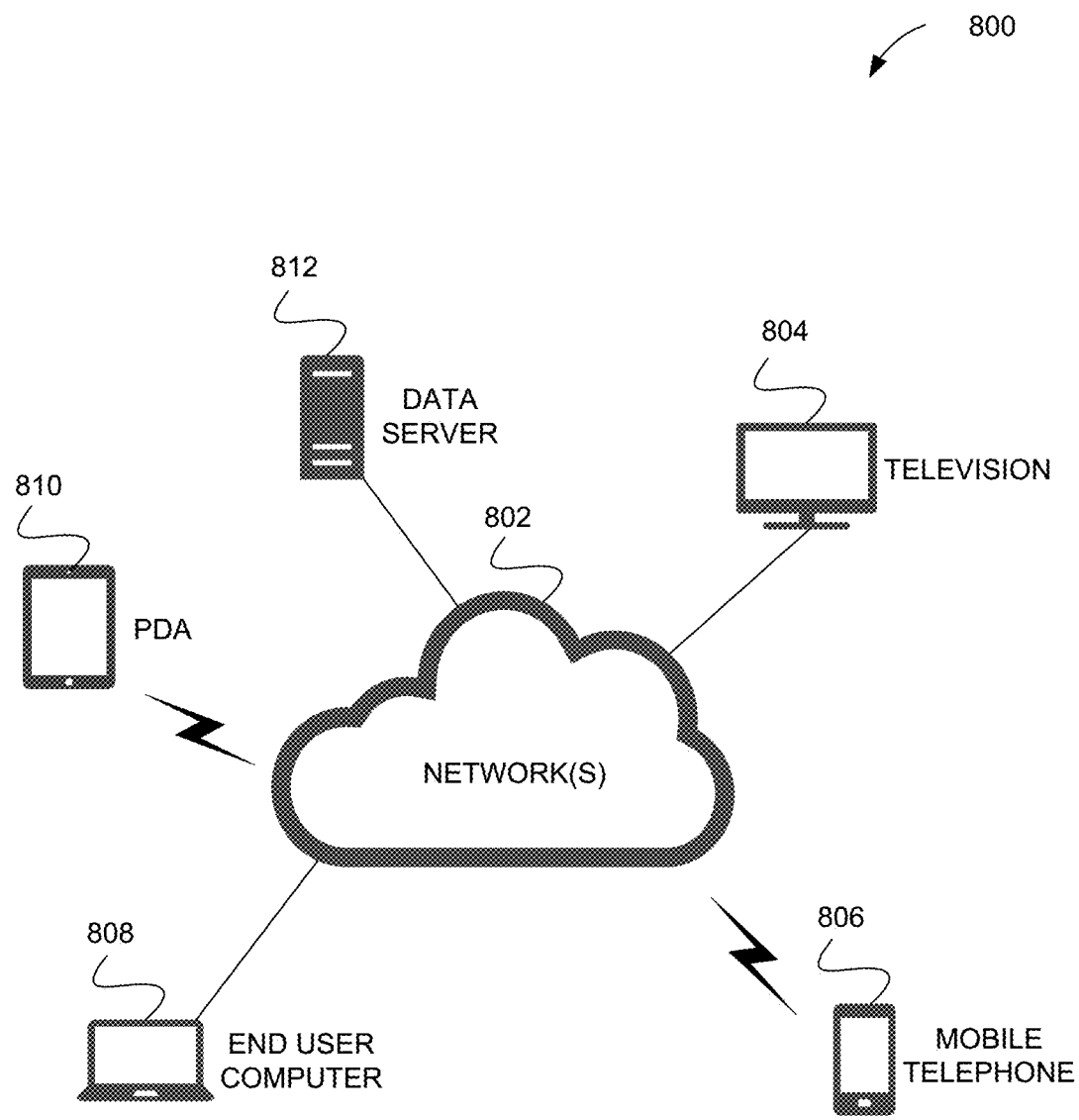
FIG. 8 illustrates a network architecture, in accordance with one possible embodiment.

FIG. 8 illustrates a network architecture 800, in accordance with one embodiment. As shown, at least one network 802 is provided. In various embodiments, any one of more of the components of the at least one network 802 may be equipped with any one or more features of the embodiments in any one or more of the previous figures.

In the context of the present network architecture 800, the network 802 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 802 may be provided.

Coupled to the network 802 is a plurality of devices. For example, a server computer 812 and an end user computer 808 may be coupled to the network 802 for communication purposes. Such end user computer 808 may include a desktop computer, lap-top computer, and/or any other type of logic. Still yet, various other devices may be coupled to the network 802 including a personal digital assistant (PDA) device 810, a mobile phone device 806, a television 804, etc.

Figure 9:
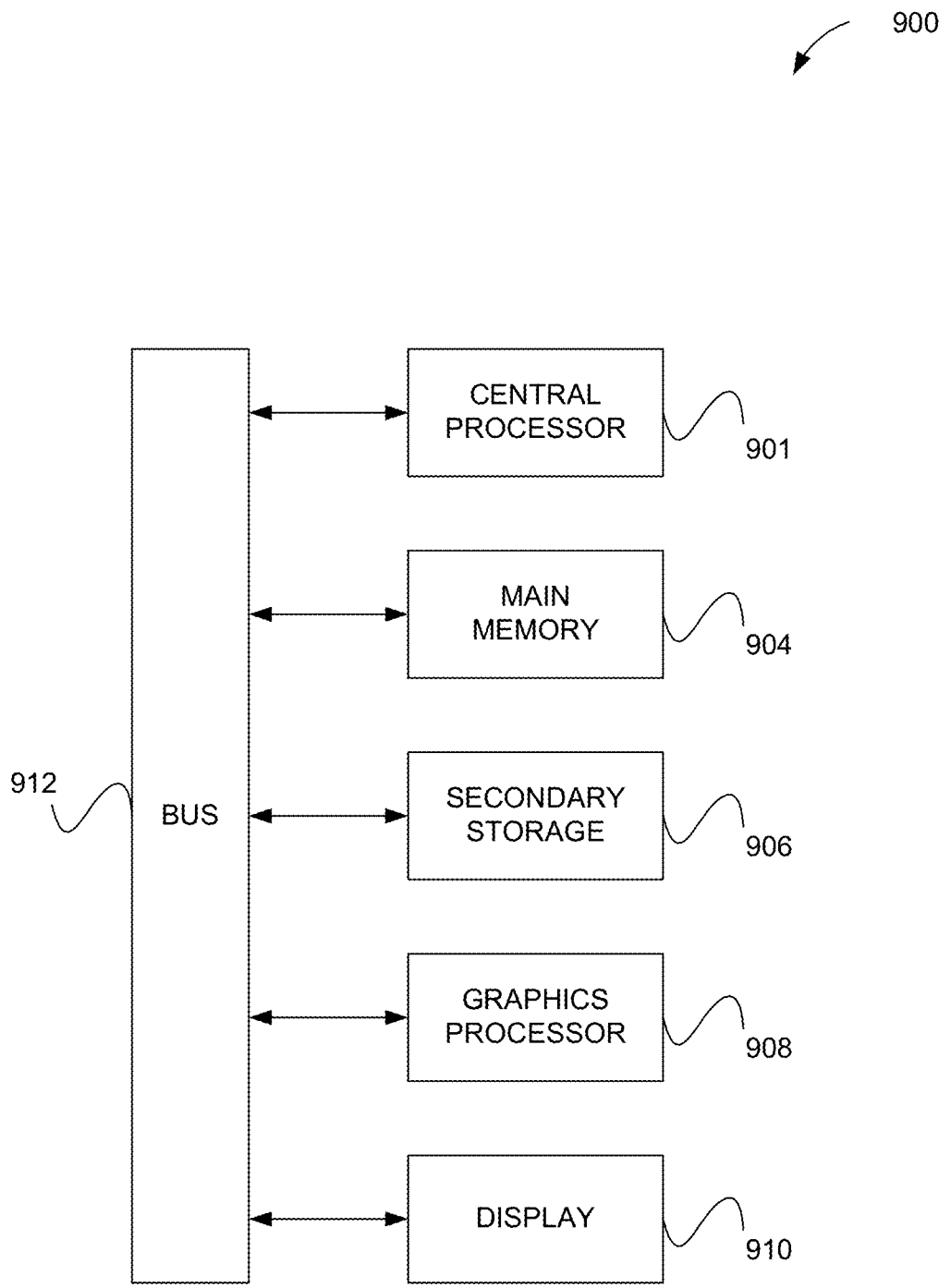
FIG. 9 illustrates an exemplary system, in accordance with one embodiment.

FIG. 9 illustrates an exemplary system 900, in accordance with one embodiment. As an option, the system 900 may be implemented in the context of any of the devices of the network architecture 800 of FIG. 8. However, it is to be appreciated that the system 900 may be implemented in any desired environment.

As shown, a system 900 is provided including at least one central processor 902 which is connected to a bus 912. The system 900 also includes main memory 904 [e.g., hard disk drive, solid state drive, random access memory (RAM), etc.]. The system 900 also includes a graphics processor 908 and a display 910.

The system 900 may also include a secondary storage 906. The secondary storage 906 includes, for example, a hard disk drive and/or a removable storage drive, representing a floppy disk drive, a magnetic tape drive, a compact disk drive, etc. The removable storage drive reads from and/or writes to a removable storage unit in a well-known manner.

Computer programs, or computer control logic algorithms, may be stored in the main memory 904, the secondary storage 906, and/or any other memory, for that matter. Such computer programs, when executed, enable the system 900 to perform various functions (as set forth above, for example). Memory 904, secondary storage 906 and/or any other storage are possible examples of non-transitory computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A method, comprising:
   transmitting a first signal utilizing a first X-phase path of a transmitter, transmission of the first signal utilizing a local oscillator of the transmitter set to a first duty ratio, wherein the local oscillator is shared by the first X-phase path of the transmitter and a second Y-phase path of the transmitter that is disabled during transmission of the first signal;
   receiving the first signal;
   measuring a first distortion level in connection with the received first signal; and
   based on the measurement of the first distortion level, setting the local oscillator of the transmitter to a second duty ratio, wherein the second duty ratio operates to reduce a second distortion level in connection with transmission of a second signal utilizing the second Y-phase path of the transmitter.

2. The method of claim 1, wherein the first signal includes a calibration signal.

3. The method of claim 1, wherein the first X-phase path of the transmitter utilizes fewer phases than the second Y-phase path of the transmitter.

4. The method of claim 1, wherein the first X-phase path of the transmitter includes a 4-phase path, and the second Y-phase path of the transmitter includes an 8-phase path.

5. The method of claim 1, wherein the second distortion level that is reduced in connection with transmission of the second signal utilizing the second Y-phase path of the transmitter includes an image distortion.

6. The method of claim 1, wherein the second distortion level that is reduced in connection with transmission of the second signal utilizing the second Y-phase path of the transmitter includes a type of distortion level other than an image distortion level.

7. The method of claim 6, wherein the type of distortion level other than the image distortion level includes at least one of a harmonic distortion or a counter-intermodulation (CIM) distortion level.

8. The method of claim 1, wherein setting the second duty ratio of the local oscillator of the transmitter is performed by a manufacturer of the transmitter.

9. The method of claim 1, wherein transmission of the second signal utilizing the second Y-phase path of the transmitter is performed without altering the second duty ratio of the local oscillator.

10. The method of claim 1, further comprising calibrating the first signal based on a measurement of an output of at least one low pass filter of the transmitter.

11. An apparatus, comprising:
    a transmitter including:
       a first X-phase path configured to transmit a first signal;
       a second Y-phase path configured to transmit a second signal, the second Y-phase path disabled during a transmission of the first signal; and
       a local oscillator shared by the first X-phase path and the second Y-phase path, wherein the first signal is generated with the local oscillator set to a first duty ratio and the second signal is generated with the local oscillator set to a second duty ratio;
    a receiver in communication with the transmitter, the receiver configured to receive the first signal and measure an first image distortion level in the first signal; and
    circuitry in communication with the receiver, the circuitry configured to set, based on the first image distortion level, the second duty ratio of the local oscillator to reduce a second image distortion level in connection with transmission of the second signal utilizing the second Y-phase path of the transmitter.

12. The apparatus of claim 11, wherein the apparatus is configured such that the first X-phase path of the transmitter utilizes a fewer number of phases than the second Y-phase path of the transmitter.

13. The apparatus of claim 11, wherein the apparatus is configured such that the first X-phase path of the transmitter includes a 4-phase path, and the second Y-phase path of the transmitter includes an 8-phase path.

14. The apparatus of claim 11, wherein the apparatus is configured such that the distortion level that is reduced in connection with transmission of the second signal utilizing the second Y-phase path of the transmitter includes an image distortion level.

15. The apparatus of claim 11, wherein the apparatus is configured such that the distortion level that is reduced in connection with transmission of the second signal utilizing the second Y-phase path of the transmitter includes a type of distortion level other than an image distortion level.

16. The apparatus of claim 15, wherein the type of distortion level other than the image distortion level includes a counter-intermodulation (CIM) distortion.

17. The apparatus of claim 15, wherein the type of distortion level other than the image distortion level includes a harmonic distortion.

18. The apparatus of claim 11, wherein the second duty ratio of the local oscillator is set by a manufacturer of the apparatus.

19. The apparatus of claim 11, wherein the apparatus is configured such that the transmission of the second signal utilizing the second Y-phase path of the transmitter is performed without altering the second duty ratio of the local oscillator.

20. A transceiver device, comprising:
    a first X-phase path configured to transmit a first signal;
    a second Y-phase path configured to transmit a second signal, the second Y-phase path disabled during a transmission of the first signal; and
    a local oscillator shared by the first X-phase path and the second Y-phase path, wherein the first signal is generated with the local oscillator set to a first duty ratio and the second signal is generated with the local oscillator set to a second duty ratio, wherein
    a first image distortion level is measured in the first signal, and
    the second duty ratio of the local oscillator is set, based on the first image distortion level, to reduce a second image distortion level in connection with transmission of the second signal utilizing the second Y-phase path of the transmitter.

* * * * *